United States Patent
Yang et al.

(10) Patent No.: US 9,449,663 B2
(45) Date of Patent: *Sep. 20, 2016

(54) CIRCUIT FOR MEMORY WRITE DATA OPERATION

(71) Applicant: TAIWAN SEMICONDUCTOR MANUFACTURING COMPANY, LTD., Hsinchu (TW)

(72) Inventors: Jung-Ping Yang, Jui-bei (TW); Cheng Hung Lee, Hsinchu (TW); Chia-En Huang, Xinfeng Township (TW); Fu-An Wu, Hsinchu (TW); Chih-Chieh Chiu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/830,809

(22) Filed: Aug. 20, 2015

(65) Prior Publication Data

US 2015/0357029 A1    Dec. 10, 2015

Related U.S. Application Data

(63) Continuation of application No. 13/804,231, filed on Mar. 14, 2013, now Pat. No. 9,117,510.

(51) Int. Cl.
*G11C 7/00* (2006.01)
*G11C 7/22* (2006.01)
*G11C 11/419* (2006.01)

(52) U.S. Cl.
CPC ............... *G11C 7/22* (2013.01); *G11C 11/419* (2013.01); *G11C 2207/2227* (2013.01)

(58) Field of Classification Search
USPC .............................. 365/189.16, 233.5, 189.09
See application file for complete search history.

(56) References Cited

U.S. PATENT DOCUMENTS

| | | | |
|---|---|---|---|
| 5,452,251 A * | 9/1995 | Akaogi | G11C 5/145 365/185.13 |
| 2009/0059706 A1 | 3/2009 | Wong | |
| 2009/0141569 A1 | 6/2009 | Nii et al. | |
| 2010/0188909 A1 | 7/2010 | Kenkare et al. | |

OTHER PUBLICATIONS

Karl, Eric et al., "A 4.6GHz 162Mb SRAM Design in 22nm Tri-Gate CMOS Technology with Integrated Active VMIN-Enhancing Assist Circuitry", ISSCC 2012, Session 13, High Performance Embedded SRAM, 13.1.

* cited by examiner

*Primary Examiner* — Vu Le
(74) *Attorney, Agent, or Firm* — Hauptman Ham, LLP

(57) ABSTRACT

A circuit includes a supply voltage circuit, a voltage adjustment circuit, and a timing adjustment circuit. The supply voltage circuit is coupled to a memory device configured to provide a voltage level to the memory device during a write data operation. The voltage adjustment circuit is coupled to the supply voltage circuit, and is configured to provide at least one voltage level control signal to control one of a plurality of different voltages. At least one of the plurality of different voltages has a voltage level lower than a specified nominal supply voltage level. The timing adjustment circuit is coupled to the supply voltage circuit, and is configured to provide at least one voltage transition timing control signal to the supply voltage circuit. The supply voltage circuit is configured to provide at least one of the plurality of different voltages to the memory device during the write data operation.

20 Claims, 15 Drawing Sheets

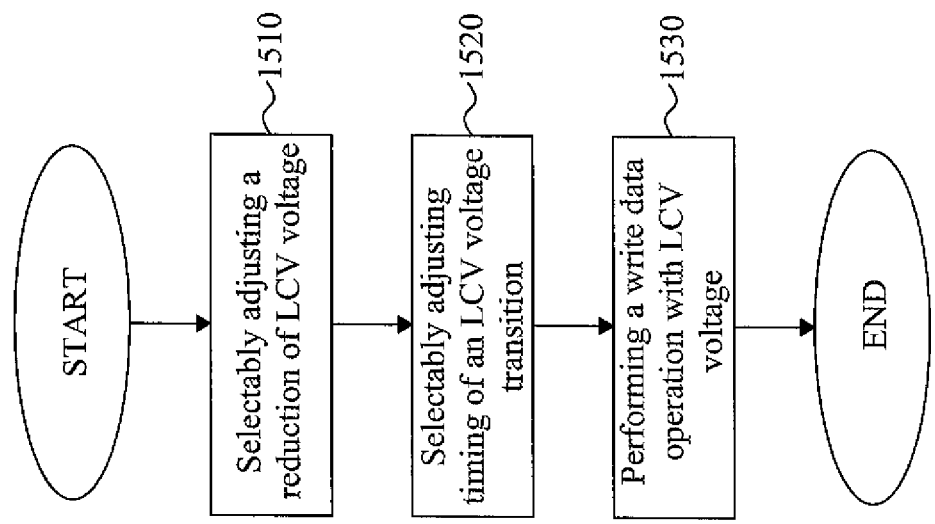

CIRCUIT FOR MEMORY WRITE DATA OPERATION

PRIORITY CLAIM

The present application is a continuation of U.S. application Ser. No. 13/804,231, filed Mar. 14, 2013, now U.S. Pat. No. 9,117,510, issued Aug. 25, 2015, which is incorporated herein by reference in its entirety.

BACKGROUND

Many electronic devices such as desktop computers, laptop computers, tablets and smart phones employ integrated and/or discrete semiconductor memory devices to store information. Such semiconductor memory devices fall into either volatile or non-volatile categories. Volatile memories lose stored information when power is removed, while non-volatile memories retain their stored information even when power is removed. Volatile memories include random access memory (RAM), which is further divided into sub-categories including static random access memory (SRAM) and dynamic random access memory (DRAM).

A typical DRAM memory cell has only one transistor and one capacitor, so it provides a high degree of integration for bulk information storage; however, DRAM requires constant refreshing and its slow speed tends to limit DRAM to computer main memories. On the other hand, an SRAM cell design, such as a 4 transistor design (4T) or a 6 transistor design (6T), use more transistors to make the SRAM cell bi-stable, meaning the SRAM cell maintains a binary output state indefinitely, as long as adequate power is supplied. While SRAM has a lower degree of integration than DRAM, SRAM can operate at a higher speed and with lower power dissipation than DRAM, so computer cache memories tend to use SRAMs. Other SRAM applications include embedded memories and networking equipment memories. While SRAM is often selected over DRAM when faster performance is important, even faster SRAM performance is desirable. Another reason SRAM is selected over DRAM is SRAM standby current is much lower than DRAM refresh current, giving SRAM an advantage where power consumption is an issue, such as in battery-powered mobile device applications. Thus, while even faster SRAM performance is desirable, maintaining or lowering SRAM power consumption is also desirable in many SRAM applications.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

FIG. 15 is a flow chart of a method for improving a write data operation of an SRAM in accordance with at least one embodiment.

DETAILED DESCRIPTION

The following disclosure provides many different embodiments, or examples, for implementing different features of the invention. Specific examples of components and arrangements are described below to simplify the present disclosure. These are examples and are not intended to be limiting.

For certain memory devices, such as SRAM, a reduced supply voltage (i.e., lower CVDD voltage "LCV"), as compared to a nominal supply voltage, produced by supply voltage circuitry, shortens write data operation cycle time, resulting in faster writing speed. As long as the reduced supply voltage is not decreased so much as to impact signal integrity, noise margins, etc., thereby interfering with the integrity of a write data operation, the smaller transition between logical low and logical high voltage values associated with the reduced supply voltage range correspondingly take less time.

One approach to implement a reduced supply voltage for SRAM write operations has significant drawbacks. For example, reduced supply voltage can be produced with a voltage divider connected between the nominal supply voltage and ground. Although proper selection of two resistors in the voltage divider produce a specified voltage level lower that the nominal supply voltage for the reduced supply voltage, this approach results in a corresponding loss of electrical efficiency and deleterious heat production. The voltage divider also incurs a chip area penalty and is inflexible in that it provides only a static reduced supply voltage with static logical state transition timing. Dynamic reduced supply voltage selection and dynamic logical state transition timing selection is provided in some embodiments.

Figure 1:
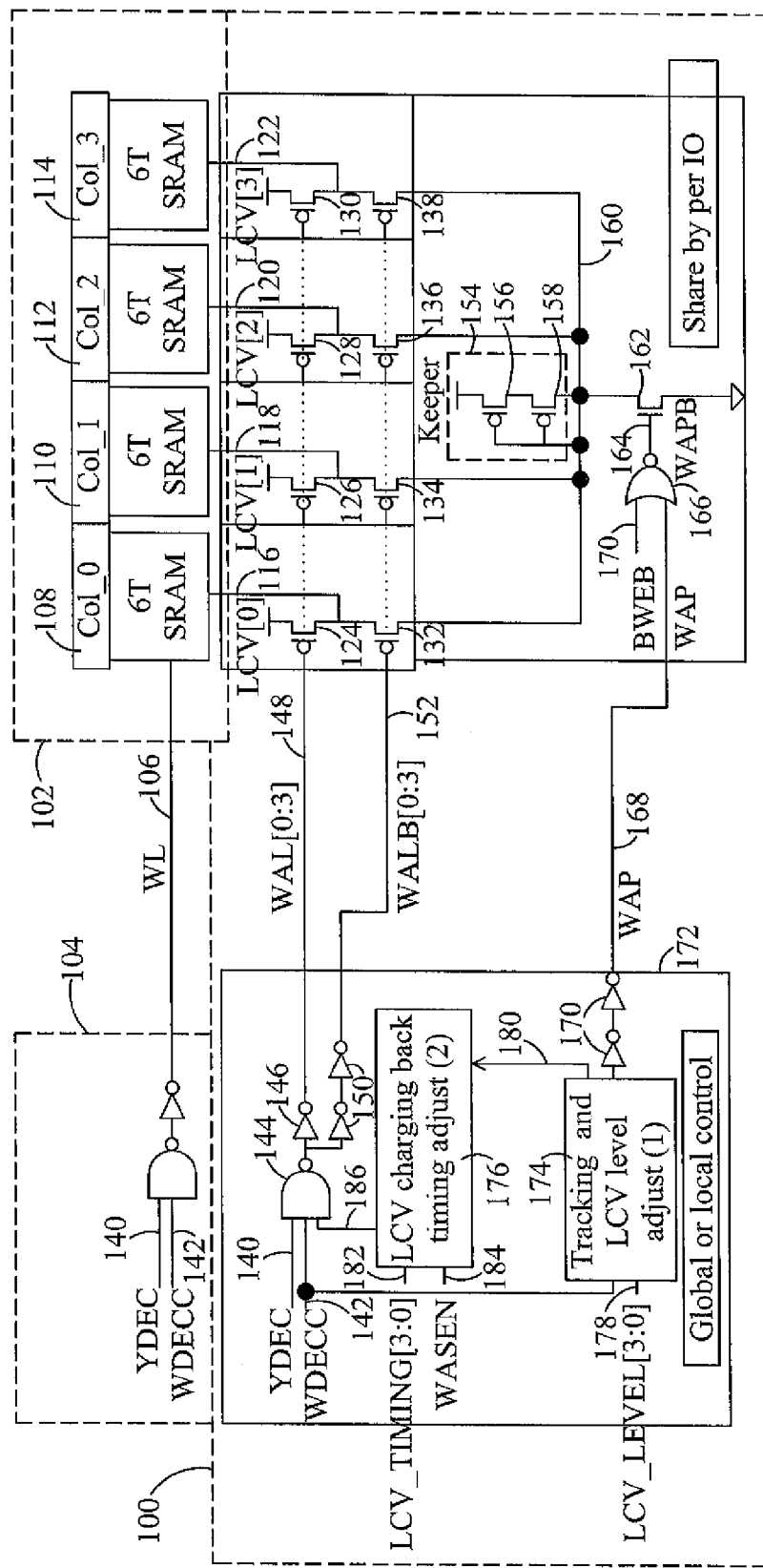
FIG. 1 is a schematic view of a pulsed dynamic LCV circuit in accordance with at least one embodiment.

FIG. 1 is a schematic view of a pulsed dynamic LCV circuit 100 that selectably produces either a nominal supply voltage or a reduced supply voltage as a pulsed dynamic lower core voltage (LCV) power signal. The dynamic lower core voltage is pulsed based on occurrence of a write data operation to a memory device like SRAM, but not limited to SRAM. The LCV circuit 100 is dynamically adjustable in terms of both voltage and charging back time. In some embodiments, the LCV circuit 100 provides electrical power to a suitable memory device.

Signal YDEC 140, also referred to as a decoded column address signal, is transmitted from control logic associated with "Y" (Row) addressing. Signal WDECC 142, also referred to as a write control clock signal, is transmitted from control logic associated with write operation timing. Signal YDEC 140 and signal WDECC 142 are received by a three-input NAND gate 144. An output terminal from the three-input NAND gate 144 is electrically coupled to inverter 146 and transmitted as four separate signals WAL[0 . . . 3] 148, also referred to as an LCV selection signal. WAL[0] 148 is electrically coupled to a gate input of a PMOS transistor 124, WAL[1] 148 is electrically coupled to a gate input of PMOS transistor 126, WAL[2] 148 is electrically coupled to a gate input of PMOS transistor 128, and WAL[3] 148 is electrically coupled to a gate input of PMOS transistor 130.

Output from the three-input NAND gate 144 is also electrically coupled to an inverter pair 150, connected in series, in addition to inverter 146. Similar to WAL[0 . . . 3] 148, inverter pair 150 transmit an output signal from the three-input NAND gate 144 as four separate signals WALB[0 . . . 3] 152, also referred to as a complementary LCV selection signal. WALB[0 . . . 3] 152 is an inverted version of WAL[0 . . . 3] 148. WALB[0] 152 is electrically coupled to a gate input of PMOS transistor 132, WALB[1] 152 is electrically coupled to a gate input of PMOS transistor 134, WALB[2] 152 is electrically coupled to a gate input of PMOS transistor 136, and WALB[3] 152 is electrically coupled to a gate input of PMOS transistor 138. A drain output terminal of PMOS transistor 124 is electrically coupled to a drain output terminal of PMOS transistor 132 and LCV[0] 116. A drain output terminal of PMOS transistor 126 is electrically coupled to a drain output terminal of PMOS transistor 134 and LCV[1] 118. A drain output terminal of PMOS transistor 128 is electrically coupled to a drain output terminal of PMOS transistor 136 and LCV[2] 120. A drain output terminal of PMOS transistor 130 is electrically coupled to a drain output terminal of PMOS transistor 138 and LCV[3] 122.

Logical high or logical low states of WAL[0 . . . 3] 148 and WALB[0 . . . 3] 152 control which voltage is selected for LCV[0 . . . 3] 116, 118, 120, 122. For example, when WAL[0 . . . 3] 148 is in a logical low state, PMOS transistors 124, 126, 128, 130 are active, and WALB[0 . . . 3] 152 is correspondingly in a logical high state causing PMOS transistors 132, 134, 136, 138 to be inactive, which has the effect of electrically coupling the nominal supply voltage to LCV[0 . . . 3] 116, 118, 120, 122. Examples, without limitation, of nominal supply voltage values are 1.8V and 3.3V, etc. When WAL[0 . . . 3] 148 is in a logical high state, PMOS transistors 124, 126, 128, 130 are inactive, WALB[0 . . . 3] 152 is correspondingly in a logical low state causing PMOS transistors 132, 134, 136, 138 to be active and electrically coupling a reduced supply voltage to LCV[0 . . . 3] 116, 118, 120, 122, the reduced supply voltage having a voltage level lower than the nominal supply voltage.

The pulsed dynamic LCV circuit 100 includes a keeper circuit 154. The keeper circuit 154 has a first keeper PMOS transistor 156 electrically coupled to the nominal supply voltage at its source terminal, while a drain terminal of the first keeper PMOS transistor 156 is electrically coupled to a source terminal of a second keeper PMOS transistor 158. A drain terminal of the second keeper PMOS transistor 158 is electrically coupled to a reduced nominal supply voltage line 160. Gate terminals from both the first keeper PMOS transistor 156 and second keeper PMOS transistor 158 are both electrically coupled together to the reduced nominal supply voltage line 160.

The reduced nominal supply voltage line 160 is electrically coupled to source input terminals of PMOS transistors 132, 134, 136, 138 to correspondingly provide reduced supply voltage to LCV[0 . . . 3] 116, 118, 120, 122. The keeper circuit 154 helps maintain the reduced supply voltage by pulling the reduced supply voltage back to a specified voltage level value during a write operation.

An NMOS transistor 162 is electrically coupled between the reduced nominal supply voltage line 160 and ground. A gate terminal of NMOS transistor 162 is connected to a WAPB signal 164 transmitted by a NOR gate 166. NOR gate 166 has two input terminals where NOR gate 166 receives a write assist pulse (WAP) signal 168 and a bit write enable bar (BWEB) signal 170 from read/write control logic. WAP signal 168 is also referred to as an LCV control pulse signal and BWEB is also referred to as a complementary bit write enable signal (active-low).

A Global or Local Control functional block 172 provides the WAL[0 . . . 3] 148, WALB[0 . . . 3] 152, and WAP 168 signals. The Global or Local Control functional block 172 includes voltage adjustment circuitry, specifically, a Tracking and LCV level adjust (1) functional block 174 and timing adjustment circuitry, specifically, an LCV charging back timing adjust (2) functional block 176 in addition to the three-input NAND gate 144, inverter 146 and inverter pair 150.

Figure 2:
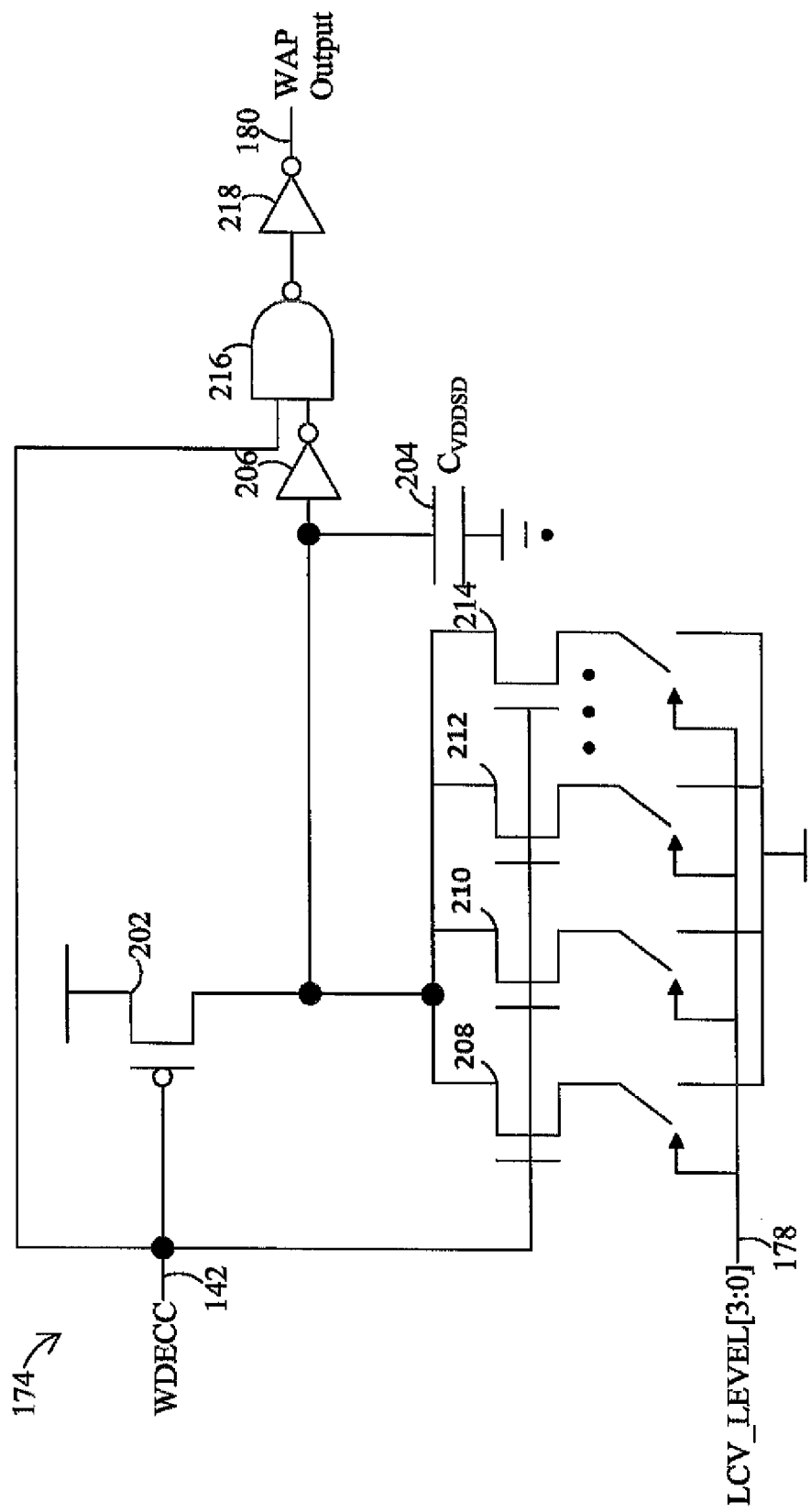
FIG. 2 is a schematic view of a tracking and LCV level adjust (1) functional block portion of a pulsed dynamic LCV circuit in accordance with at least one embodiment.
Figure 3:
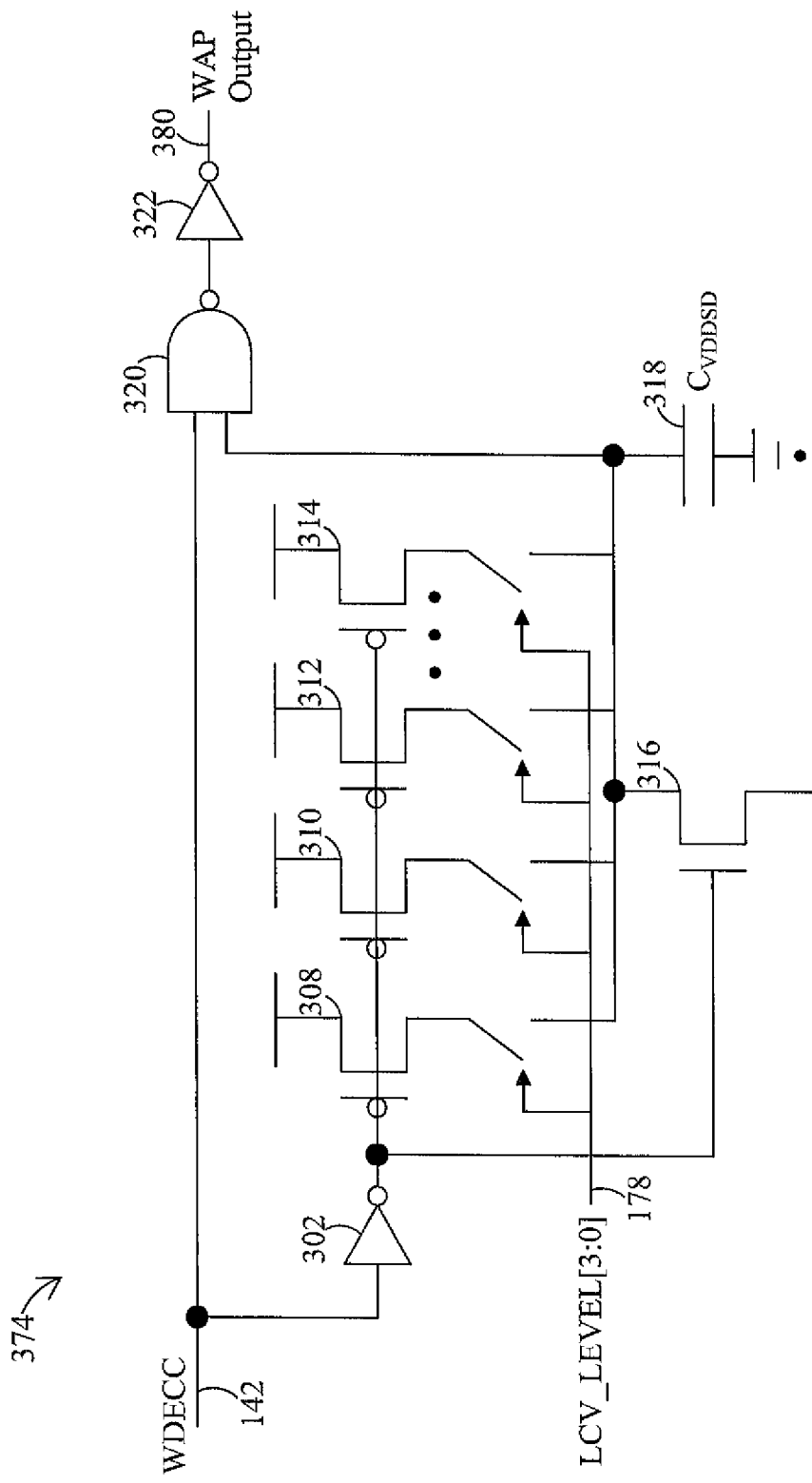
FIG. 3 is a schematic view of an alternative tracking and LCV level adjust (1) functional block portion of a pulsed dynamic LCV circuit in accordance with at least one embodiment.
Figure 4:
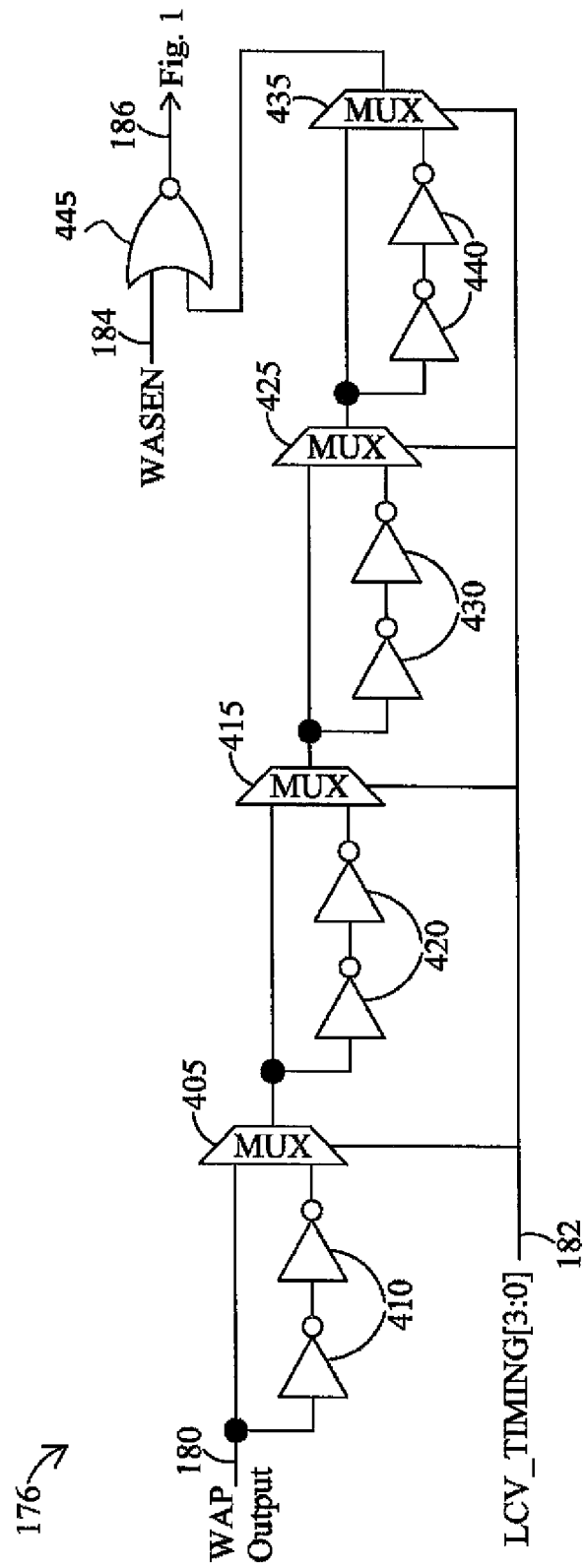
FIG. 4 is a schematic view of an LCV charging back timing adjust (2) functional block portion of a pulsed dynamic LCV circuit in accordance with at least one embodiment.

The Tracking and LCV level adjust (1) functional block 174 receives the WDECC 142 signal, LCV_LEVEL[3:0] 178 (four bits for individually controlling transistors to specify one voltage drop from a plurality of different voltage level drops for LCV[3:0] 116-122) and transmits a write assist pulse (WAP) Output signal 180 through an inverter pair 179 connected in series to transmit the WAP signal 168. Referring to FIG. 2 and FIG. 3, each of the four bits of LCV_LEVEL[3:0] 178 individually control one of four switches connected in parallel and electrically coupled between a $C_{VDDSD}$ capacitor and a voltage supply source. The greater the number switches that are closed and electrically couple the $C_{VDDSD}$ capacitor to the voltage supply source, the greater the corresponding ability to discharge (FIG. 2) or charge (FIG. 3) the $C_{VDDSD}$ capacitor. As described herein and referring to FIG. 5, the charge on the $C_{VDDSD}$ capacitor controls voltage levels reached by LCV [3:0] in accordance with some embodiments. WAP Output signal 180 is also transmitted from the Tracking and LCV level adjust (1) functional block 174 to the LCV charging back timing adjust (2) functional block 176. The LCV charging back timing adjust (2) functional block 176 receives the WAP output signal 180, signals LCV_TIMING [3:0] 182 (four bits for individually controlling transistors to specify one voltage timing delay from a plurality of different voltage timing delays for LCV[3:0] 116-122) and a write assist enable (WASEN) signal 184 from read/write control logic and transmits an output signal 186 to the remaining input of the three-input NAND gate 144. WASEN signal 184 is also referred to as an LCV enable signal. Referring to FIG. 4, each of the four bits of LCV_TIMING[3:0] 182 individually control one of four multiplexers (MUXes) connected serially. In turn, each of the four MUXes determine whether a control signal the MUXes are passing is delayed by either a shorter or longer length of time. Correspondingly, the greater the number MUXes that select a longer delay, the greater the total delay a transition in the control signal will incur as it passes through the MUXes. As described herein and referring to FIG. 5, delay in a transition in the control signal correspondingly affects delay in a transition in voltage levels reached by LCV[3:0] in accordance with some embodiments.

In some embodiments, the suitable memory device electrically coupled to the LCV circuit 100 is an SRAM having a bank of SRAM cells 102 using a 6 transistor (6T) design. In some embodiments the bank of SRAM cells 102 has four SRAM columns, specifically, Col_0 108, Col_1 110, Col_2 112 and Col_3 114. Col_0 108 is electrically coupled to LCV[0] 116, Col_1 110 is electrically coupled to LCV[1] 118, Col_2 112 is electrically coupled to LCV[2] 120, and Col_3 114 is electrically coupled to LCV[3] 122. Each of the four LCV[0:3] power signals 116, 118, 120, 122 selectably provides either nominal supply voltage through corresponding PMOS transistors 124, 126, 128, 130, or reduced power supply voltage through corresponding PMOS transistors 132, 134, 136, 138. Therefore, each of the four SRAM columns 108, 110, 112, 114 receives a separate pulsed dynamic LCV power signal from the LCV circuit 100 to enable faster write data operation.

The bank of SRAM cells 102 is electrically coupled to a word line driver 104. The word line (WL) driver 104 transmits a WL signal 106 to the bank of SRAM cells 102. The WL signal 106 is electrically coupled to each of the four SRAM columns 108, 110, 112, 114.

One or more embodiments provide an improved column-based write operation scheme with a reduced supply voltage having one or more of the following features: 1) configurable LCV voltage level; 2) configurable charging back timing; 3) a process-voltage-temperature (PVT)-aware characteristic; 4) reduced area penalty; 5) significantly reduced direct current (DC) leakage; 6) applicability to BWEB function; 7) stable PVT sensitivity; 8) improved loading tracking on a bit line (BL), power line, and input/output (I/O); and 9) a practical implementation readily embedded in a memory device, in some embodiments, an SRAM device.

FIG. 2 is a schematic view of voltage adjustment circuitry, including the Tracking and LCV level adjust (1) functional block 174. WDECC 142 is electrically coupled to a gate input of a PMOS transistor 202. A source terminal of PMOS transistor 202 is electrically coupled to the nominal supply voltage and a drain terminal of PMOS transistor 202 is electrically coupled to capacitor $C_{VDDSD}$ 204 (whose other input is grounded), an input of inverter 206 and drain inputs of NMOS transistors 208, 210, 212, 214. In some embodiments NMOS transistors 208, 210, 212, 214 are greater or fewer in number as specified for current carrying capacity. LCV_LEVEL[3:0] 178 signals individually and switchably control which source terminals of NMOS transistors 208, 210, 212, 214 are electrically coupled to ground. An output of inverter 206 is electrically coupled to a first input of NAND 216. WDECC 142 is coupled to a second input of NAND 216. An output of NAND 216 is electrically coupled to an inverter 218 to produce the WAP Output 180.

FIG. 3 is a schematic view of some embodiments with Tracking and LCV level adjust (1) functional block 374. Note that function block 174 in FIG. 1 and FIG. 2 uses more NMOS transistors, while functional block 374 uses more PMOS transistors and either is selected depending on which configuration is specified for a given implementation. WDECC 142 is electrically coupled to an input of an inverter 302. An output from the inverter 302 is electrically coupled to gate input terminals for PMOS transistors 308, 310, 312, 314. Source terminals of PMOS transistors 308, 310, 312, 314 are electrically coupled to the nominal supply voltage. LCV_LEVEL[3:0] 178 signals individually and switchably control (in part) which drain terminals of PMOS transistors 308, 310, 312, 314 are electrically coupled to ground. In some embodiments PMOS transistors 308, 310, 312, 314 are greater or fewer in number as specified for current carrying capacity.

Output of inverter 302 is electrically coupled to a gate input terminal of NMOS transistor 316. A source terminal of NMOS transistor 316 is electrically coupled to ground. NMOS transistor 316 also switchably controls (in part) whether drain terminals of PMOS transistors 308, 310, 312, 314 are electrically coupled to ground. A drain terminal of NMOS transistor 316 is switchably coupled to PMOS transistors 308, 310, 312, 314 as described above. The drain terminal of NMOS transistor 316 is electrically coupled to capacitor $C_{VDDSD}$ 318 (whose other input is grounded). Capacitor $C_{VDDSD}$ 318 is switchably coupled to the drain terminals of PMOS transistors 308, 310, 312, 314. The drain terminal of NMOS transistor 316 is also electrically coupled to a first input terminal of NAND gate 320. A second input terminal of NAND gate 320 is electrically coupled to WDECC 142. Output signals transmitted from NAND gate 320 are electrically coupled to inverter 322. In some embodiments, WAP Output 380 is transmitted from inverter 322.

FIG. 4 is a schematic view of timing adjustment circuitry, specifically, the LCV charging back timing adjust (2) functional block 176. Functional block 176 is electrically coupled to WAP output 180, LCV_TIMING[3:0] 182 and WASEN 184 and transmits output signal 186 to the three-input NAND gate 144 as described above. WAP Output 180 is electrically coupled to a first input of multiplexer (MUX) 405 and a pair of inverters 410. Output from the pair of inverters 410 is electrically coupled to a second input of MUX 405. MUX 405 is controlled by a corresponding bit from LCV_TIMING[3:0], such as LCV_TIMING[3], to select between WAP Output 180 and the output from the pair of inverters 410. Similarly, output from MUX 405 is electrically coupled to a first input of MUX 415 and a pair of inverters 420. Output from the pair of inverters 420 is electrically coupled to a second input of MUX 415. Output from MUX 415 is selected by a unique bit from LCV_TIMING[3:0], such as LCV_TIMING[2]. Output from MUX 415 is electrically coupled to a first input of MUX 425 and a pair of inverters 430. Output from the pair of inverters 430 is electrically coupled to a second input of MUX 425. Output from MUX 425 is selected by a unique bit from LCV_TIMING[3:0], such as LCV_TIMING[1]. Output from MUX 425 is electrically coupled to a first input of MUX 435 and a pair of inverters 440. Output from the pair of inverters 440 is electrically coupled to a second input of MUX 435. Output from MUX 435 is selected by a unique bit from LCV_TIMING[3:0], such as LCV_TIMING[0], and electrically coupled to a first input terminal of NOR gate 445. A second input terminal of NOR gate 445 is coupled to WASEN 184. NOR gate 445 produces output signal 186 which is electrically coupled to three-input NAND gate 144 as described above and shown in FIG. 1

Figure 5:
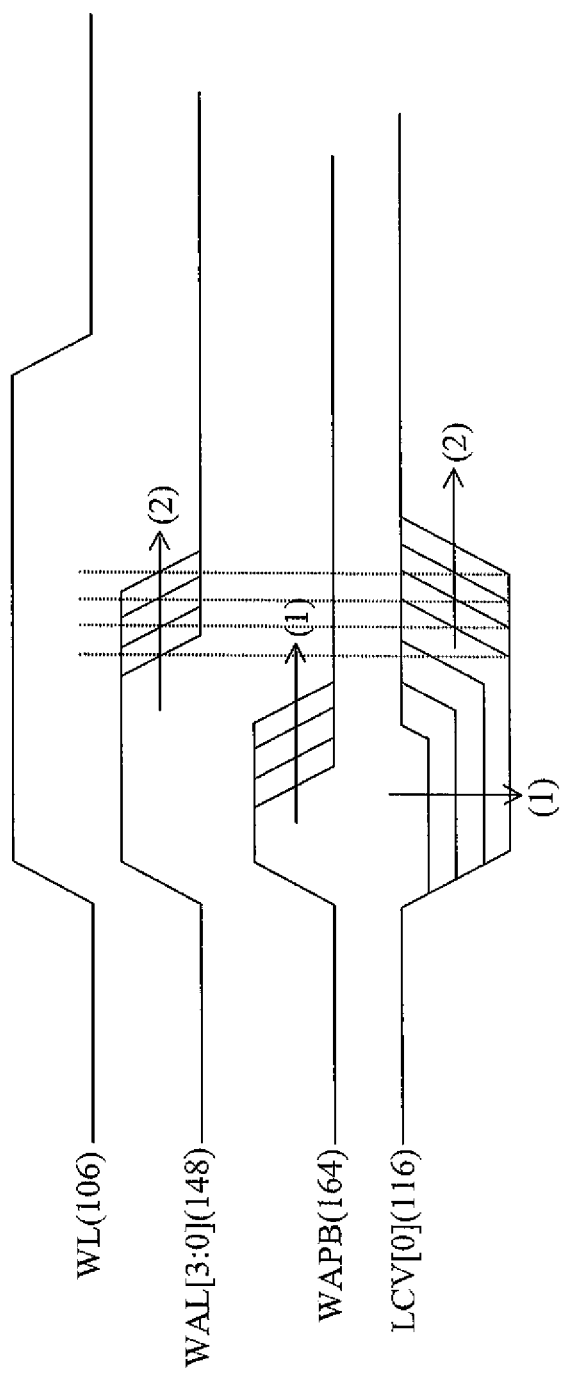
FIG. 5 is a waveform timing diagram of a pulsed dynamic LCV circuit performing a write operation in accordance with at least one embodiment.

FIG. 5 is a waveform timing diagram of a pulsed dynamic LCV circuit in a write operation in accordance with at least one embodiment. Because the YDEC 140 and WDECC 142 signals are transitioning between logical states to initiate a write operation and are used at least in part to generate WL 106, WAL[3:0] 148, WAPB 164 and LCV[0] 116, all waveform edges are shown in FIG. 5 as being synchronous, ignoring for illustration purposes any minor differences between the edges due to delays imposed by intervening circuitry, line loading, etc. The word line (WL) 106 signal is electrically coupled to the SRAM bank 102 to access a word of SRAM memory cells 108, 110, 112, 114 in FIG. 5 for a write operation. WL 106 transitions from a logical low state to a logical high state and back to a logical low state, providing a window for a write operation during that portion when WL 106 is in its logical high state. WAL[0:3] 148 also transitions initially to a logical high state, thereby deactivating PMOS transistors 124, 126, 128, 130 and disconnecting the nominal supply voltage from LCV[0:3] 116, 118, 120, 122. Correspondingly, WALB[0:3] 152, being an inverted version of WAL[0:3] 148, transitions initially to a logical low state, thereby activating PMOS transistors 132, 134, 136, 138 and connecting the reduced nominal supply voltage line 160 to LCV[0] which is electrically coupled to SRAM column Col_0 108. Note that for illustration purposes, LCV[0] is representative of LCV[0:3] 116, 118, 120, 122. The reduced nominal supply voltage present on line 160 and LCV[0] is advantageous for performing a write data operation because due to the decreased voltage range, shorter write cycles are needed to achieve the voltages representing the target logical high/low values.

Timing for a WAPB 164 waveform is controlled by the tracking and LCV level adjust (1) 174. As described with regard to FIGS. 2 and 3, LCV_LEVEL[3:0] bits 178 control how many of the four NMOS transistors 208, 210, 212, 214 are electrically coupled to ground. The number of NMOS transistors 208, 210, 212, 214 that are selectably electrically coupled to ground correspond to the four spaced transitions from logical high to logical low in WAPB 164. The longer WAPB 164 is in a logical high state, the longer NMOS transistor 162 is electrically coupled to ground, and correspondingly, the deeper LCV[0] 116 is pulled down from an initial logical high state towards ground (a logical low state). Lower voltages on LCV[0] result in improved performance, however, if the voltage becomes too low, SRAM circuitry will fail to write the date properly. The pulsed dynamic LCV circuit 100, specifically, the tracking and LCV level adjust (1) 174 functional block portion of the pulsed dynamic LCV circuit 100 enables adjustment of reduced supply voltages provided to SRAM 102 to be optimized between write speed and reliability.

Another advantage of the pulsed dynamic LCV circuit 100 is shown in FIG. 5 with respect to the LCV charging back timing adjust (2) 176 portion. After the data has been written to the SRAM 102, the LCV circuit 100 drives the voltage received by the SRAM 102 via LCV[0] 116 back to the nominal supply voltage, producing faster write data cycles and shorter write data times, by supplying additional voltage to ensure the bits written to the SRAM are in the proper final state when the write operation is ended. As described with regard to FIG. 4, LCV_TIMING[3:0] 182 bits control MUXes 405, 415, 425, 435 that in turn control how much delay is introduced to the WAP signal 180. The four delay values from the four MUXes 405, 415, 425, 435 correspond to the four different transitions in WAL[3:0] 148 from logical high to logical low as shown in FIG. 5. The timing of these transitions determines when LCV[0] is electrically coupled to the nominal supply voltage through PMOS transistor 124. The effect of the four logical high to logical low transitions in WAL[3:0] 148 can be seen in the four logical low to logical high transitions in LCV[0] as it returns to the nominal supply voltage at the end of a write cycle. The pulsed dynamic LCV circuit 100, specifically, the LCV charging back timing adjust (2) 176 functional block portion of the pulsed dynamic LCV circuit 100, enables adjustment of timing of return to nominal supply voltage provided to SRAM 102 in a write operation to be optimized to occur at a time early enough to provide assistance to the SRAM 102, but late enough to still enable the initial transition to occur at a reduced supply voltage.

With regard to FIG. 6 through FIG. 14, these figures are schematic views of alternative circuitry to the above described pulsed dynamic LCV circuit in accordance with at least one embodiment. Similar reference numerals designate similar circuitry in FIG. 6 through FIG. 14 as compared to FIG. 1 through FIG. 5.

Figure 6:
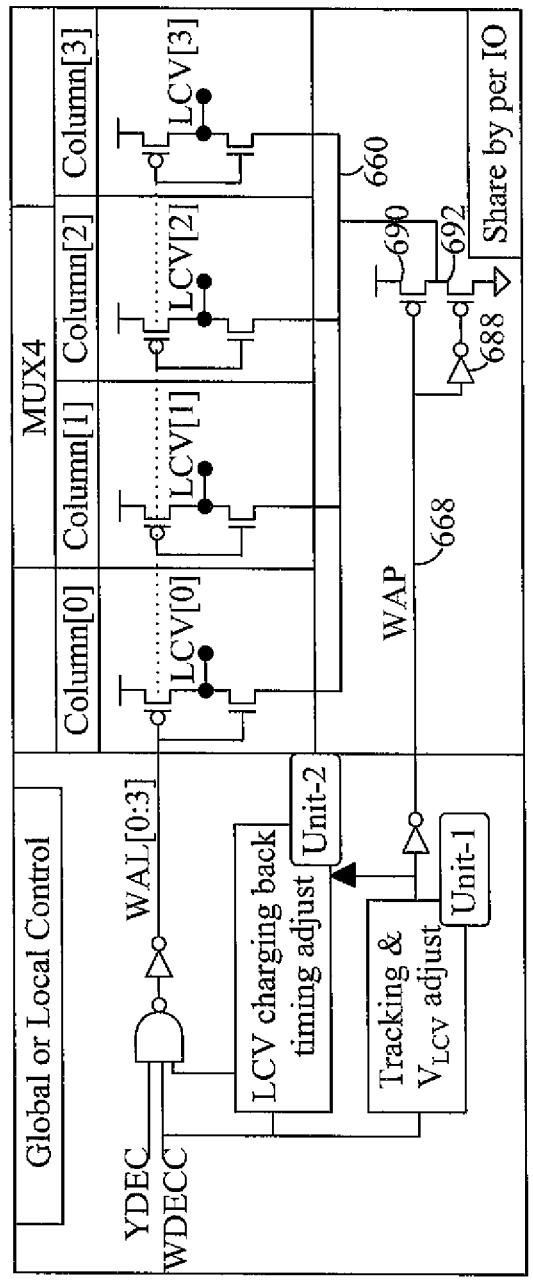
FIG. 6 is a schematic view of a pulsed dynamic LCV circuit in accordance with at least one embodiment.

FIG. 6 is a schematic view of an alternative pulsed dynamic LCV circuit in accordance with at least one embodiment. The WAP signal 668 is transmitted to an inverter 688 and a first PMOS transistor 690. Output from the inverter 188 is electrically coupled to a second PMOS transistor 692. A drain terminal of the first transistor 690 is electrically coupled to a source terminal of the second transistor 692 and the reduced supply voltage line 660. A source terminal of the first PMOS transistor 690 is connected to the nominal power supply and a drain terminal of the second PMOS transistor 692 is connected to ground.

Figure 7:
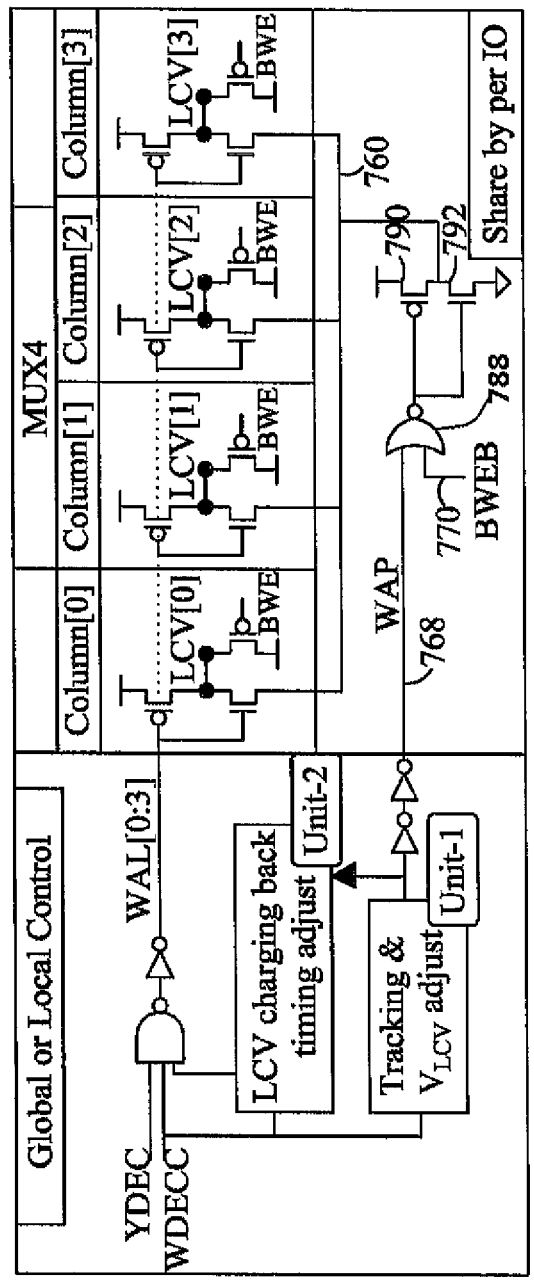
FIG. 7 is a schematic view of a pulsed dynamic LCV circuit in accordance with at least one embodiment.

FIG. 7 is a schematic view of an alternative pulsed dynamic LCV circuit in accordance with at least one embodiment. The WAP signal 768 and BWEB signal 770 are transmitted to a NOR gate 788. Output from the NOR gate 788 is electrically coupled to a PMOS transistor 790 and an NMOS transistor 792. A drain terminal of the PMOS transistor 790 is electrically coupled to a drain terminal of the NMOS transistor 792 and the reduced supply voltage line 760. A source terminal of the first PMOS transistor 790 is connected to the nominal power supply and a source terminal of the NMOS transistor 792 is connected to ground.

Figure 8:
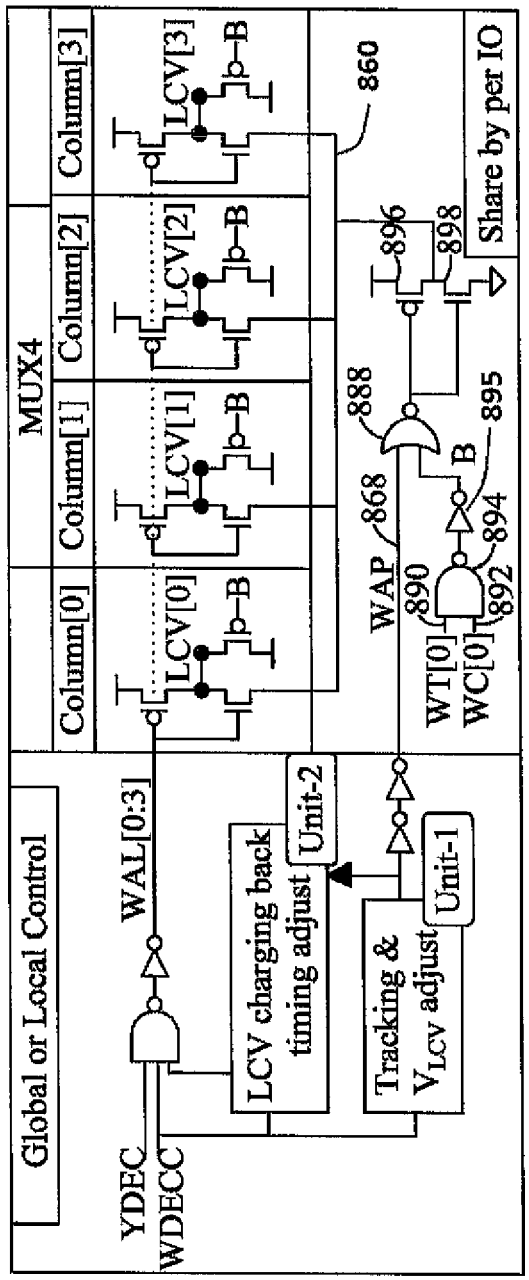
FIG. 8 is a schematic view of a pulsed dynamic LCV circuit in accordance with at least one embodiment.

FIG. 8 is a schematic view of an alternative pulsed dynamic LCV circuit in accordance with at least one embodiment. The WAP signal 868 is transmitted to a NOR gate 888. A WT[0] signal 890 and a WC[0] signal 892 are transmitted to a NAND gate 894. Output from the NAND gate 894 is electrically coupled to NOR gate 888 through an inverter 894. Output from the NOR gate 888 is electrically coupled to a PMOS transistor 896 and an NMOS transistor 898. A drain terminal of the PMOS transistor 896 is electrically coupled to a drain terminal of the NMOS transistor 898 and the reduced supply voltage line 860. A source terminal of the PMOS transistor 896 is connected to the nominal power supply and a source terminal of the NMOS transistor 898 is connected to ground.

Figure 9:
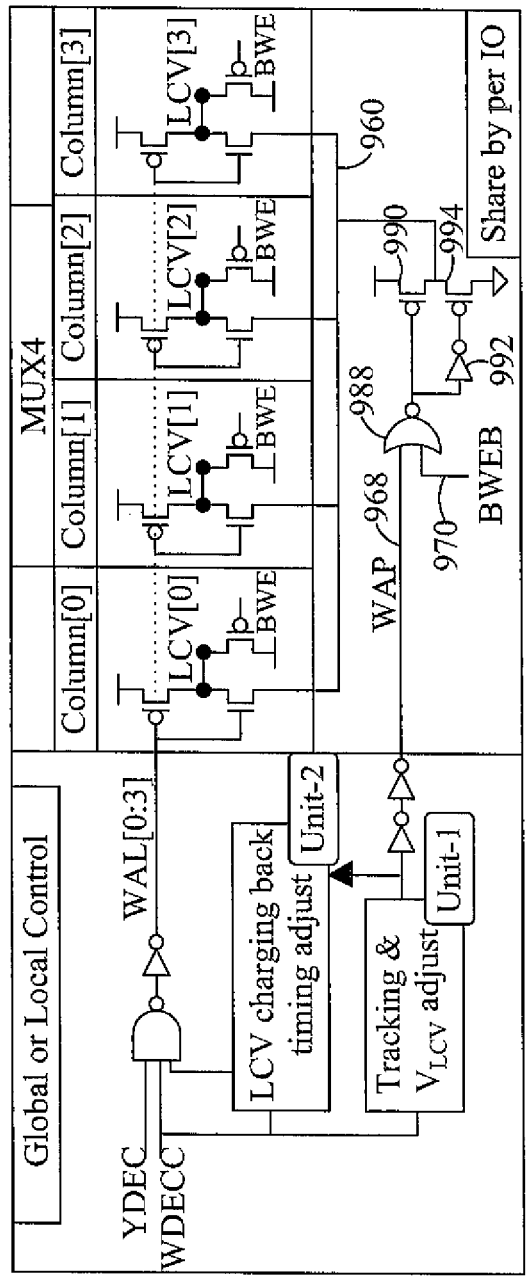
FIG. 9 is a schematic view of a pulsed dynamic LCV circuit in accordance with at least one embodiment.

FIG. 9 is a schematic view of an alternative pulsed dynamic LCV circuit in accordance with at least one embodiment. The WAP signal 968 and BWEB signal 970 are transmitted to a NOR gate 988. Output from the NOR gate 988 is electrically coupled to a gate input of a first PMOS transistor 990 and through an inverter 992 to a gate input of a second PMOS transistor 994. A drain terminal of the first PMOS transistor 990 is electrically coupled to a source terminal of the second PMOS transistor 994 and the reduced supply voltage line 960. A source terminal of the first PMOS transistor 990 is connected to the nominal power supply and a drain terminal of the second PMOS transistor 994 is connected to ground.

Figure 10:
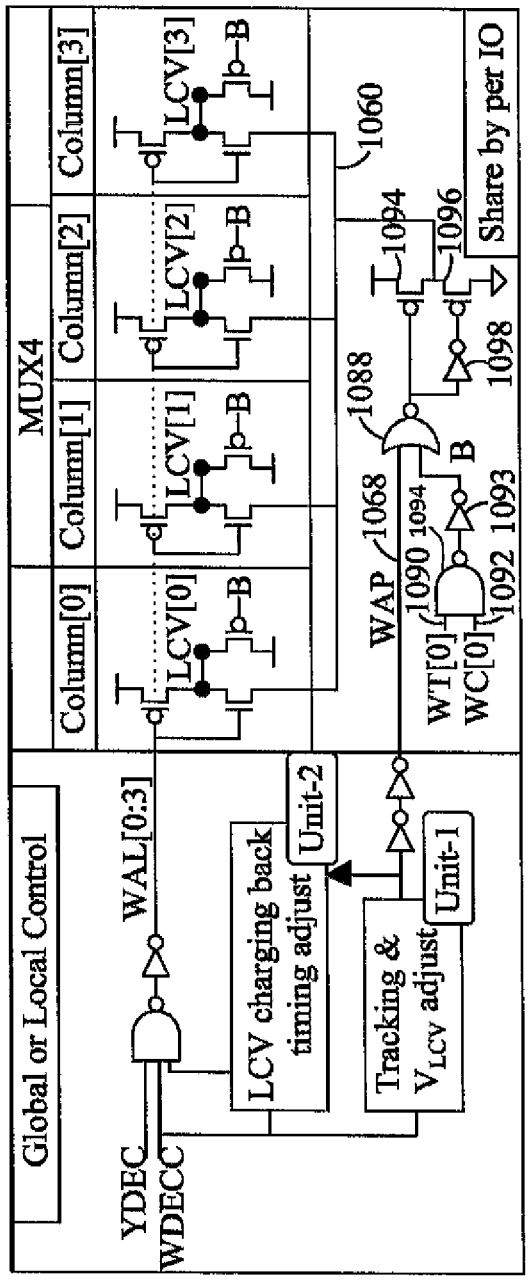
FIG. 10 is a schematic view of a pulsed dynamic LCV circuit in accordance with at least one embodiment.

FIG. 10 is a schematic view of an alternative pulsed dynamic LCV circuit in accordance with at least one embodiment. The WAP signal 1068 is transmitted to a NOR gate 1088. A WT[0] signal 1090 and a WC[0] signal 1092 are transmitted to a NAND gate 1094. Output from the NAND gate 1094 is electrically coupled to NOR gate 1088 through an inverter 1093. Output from the NOR gate 1088 is electrically coupled to a first PMOS transistor 1094 a second PMOS transistor 1096 through an inverter 1098. A drain terminal of the first PMOS transistor 1094 is electrically coupled to a source terminal of the second PMOS transistor 1096 and the reduced supply voltage line 1060. A source terminal of the PMOS transistor 1094 is connected to the nominal power supply and a drain terminal of the second PMOS transistor 1096 is connected to ground.

Figure 11:
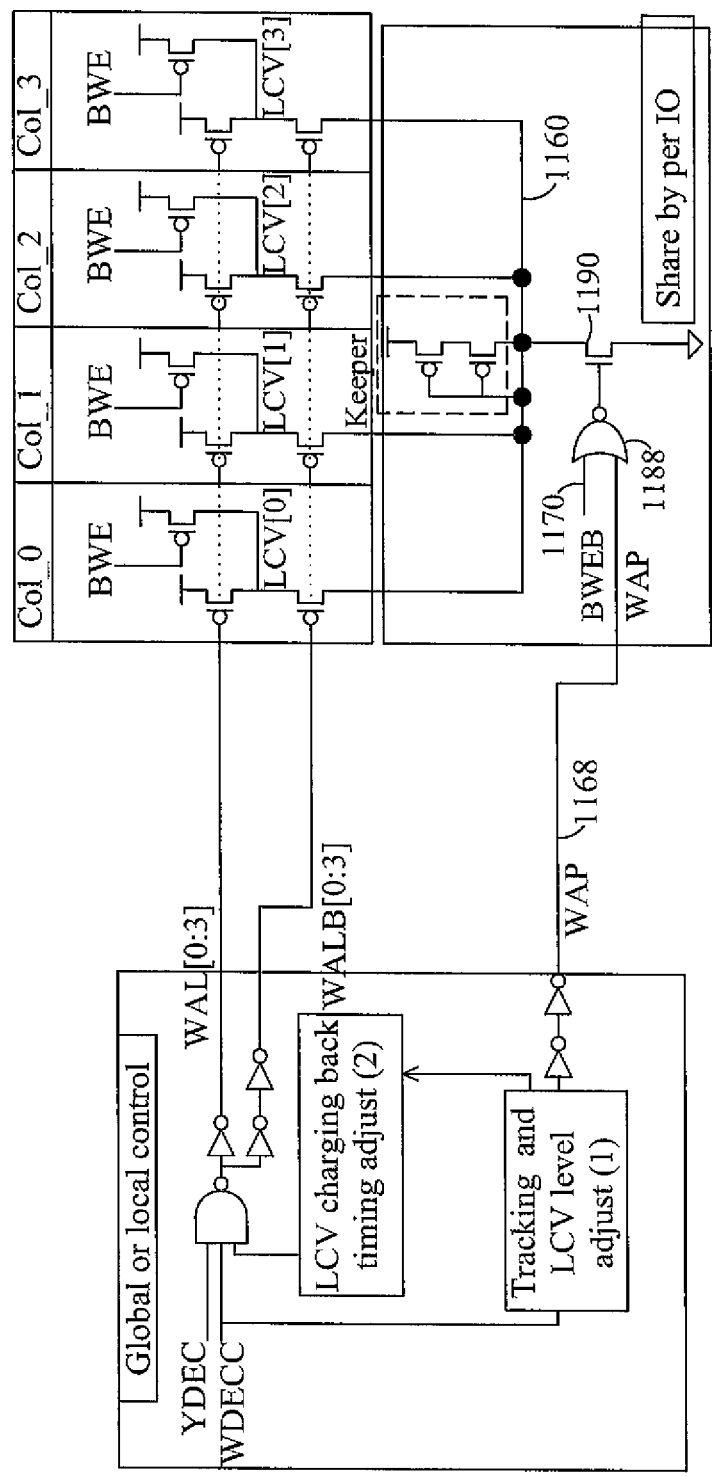
FIG. 11 is a schematic view of a pulsed dynamic LCV circuit in accordance with at least one embodiment.

FIG. 11 is a schematic view of an alternative pulsed dynamic LCV circuit in accordance with at least one embodiment. The WAP signal 1168 and BWEB signal 1170 are transmitted to a NOR gate 1188. Output from the NOR gate 1188 is electrically coupled to an NMOS transistor 1190. A drain terminal of the NMOS transistor 1190 is electrically coupled to the reduced supply voltage line 1160. A source terminal of the NMOS transistor 1190 is electrically coupled to ground.

Figure 12:
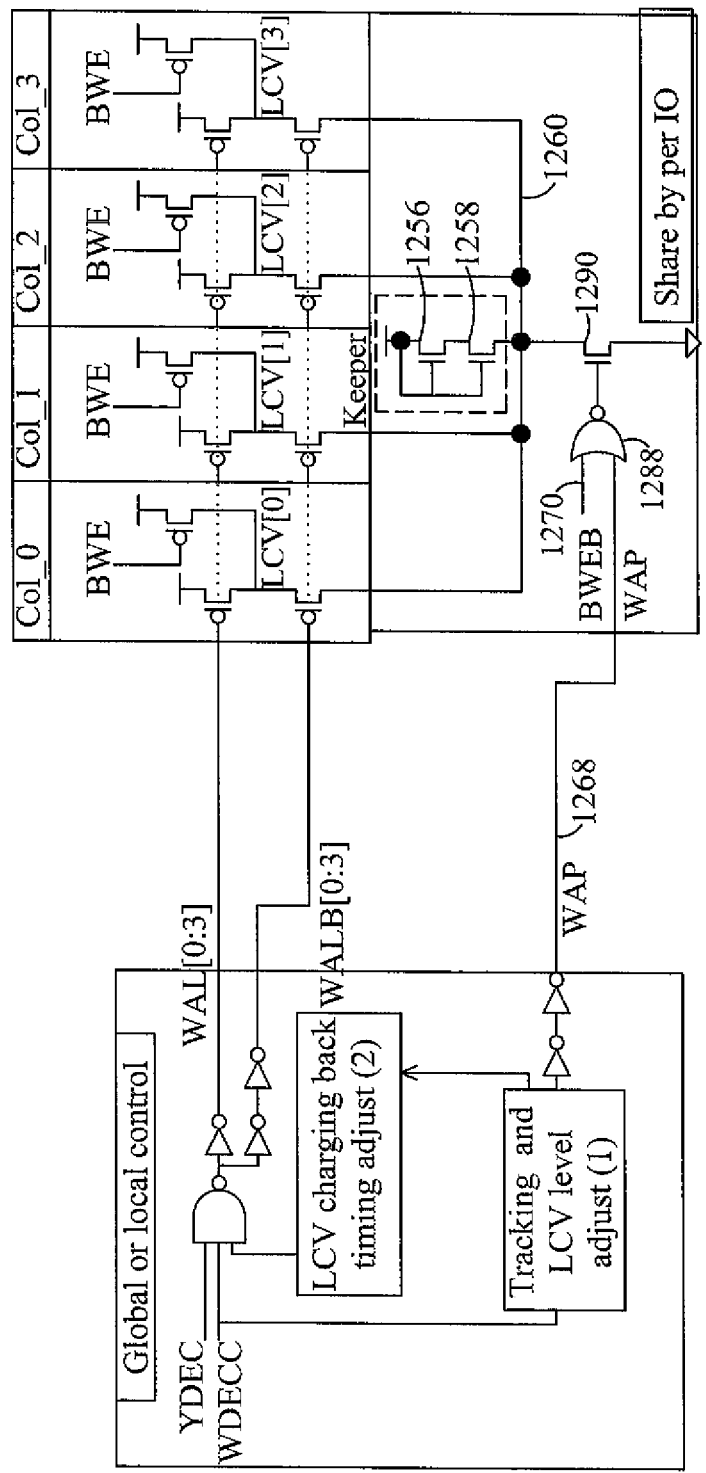
FIG. 12 is a schematic view of a pulsed dynamic LCV circuit in accordance with at least one embodiment.

FIG. 12 is a schematic view of an alternative pulsed dynamic LCV circuit in accordance with at least one embodiment. The WAP signal 1268 and BWEB signal 1270 are transmitted to a NOR gate 1288. Output from the NOR gate 1288 is electrically coupled to an NMOS transistor 1290. A drain terminal of the NMOS transistor 1290 is electrically coupled to the reduced supply voltage line 1260. A source terminal of the NMOS transistor 1290 is electrically coupled to ground. PMOS transistor 156 from FIG. 1 is replaced with NMOS transistor 1256 and PMOS transistor 158 from FIG. 1 is replaced with NMOS transistor 1258 in this alternative embodiment. Gate input terminals of NMOS transistors 1256, 1258 are both connected to the nominal supply voltage, thereby allowing replacement of PMOS transistors 156, 158 with NMOS transistors 1256, 1258.

Figure 13:
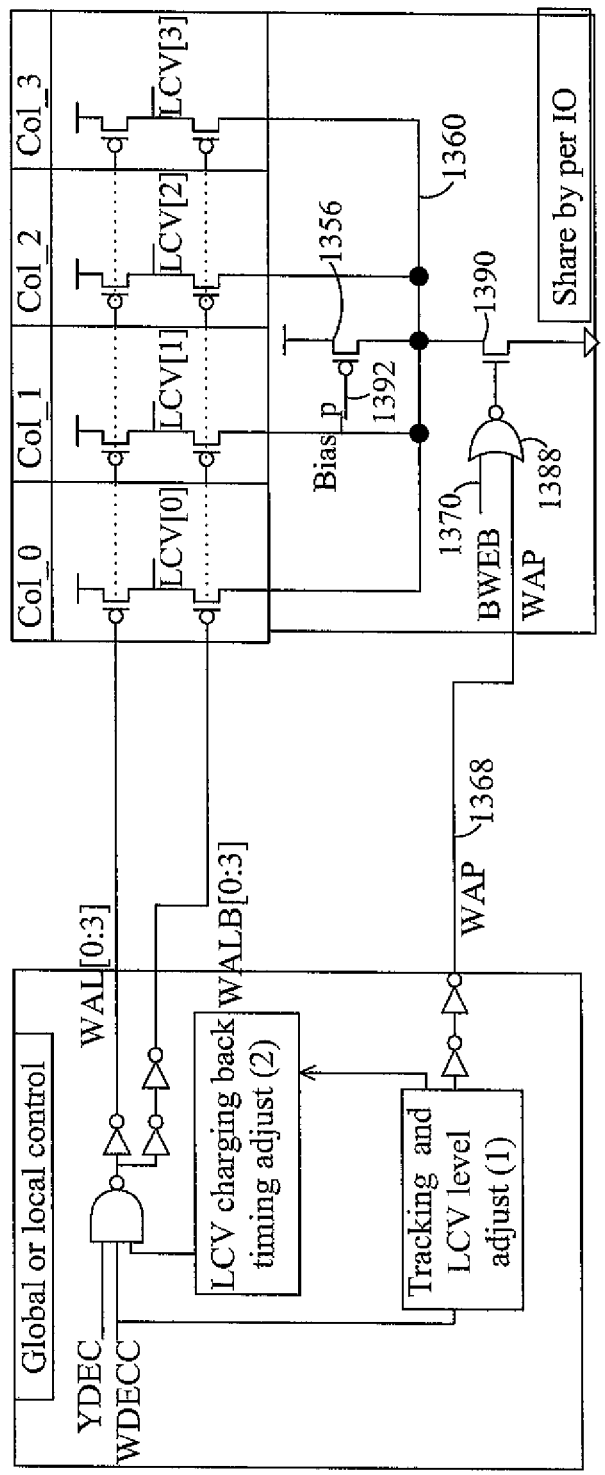
FIG. 13 is a schematic view of a pulsed dynamic LCV circuit in accordance with at least one embodiment.

FIG. 13 is a schematic view of an alternative pulsed dynamic LCV circuit in accordance with at least one embodiment. The WAP signal 1368 and BWEB signal 1370 are transmitted to a NOR gate 1388. Output from the NOR gate 1388 is electrically coupled to an NMOS transistor 1390. A drain terminal of the NMOS transistor 1390 is electrically coupled to the reduced supply voltage line 1360. A source terminal of the NMOS transistor 1390 is electrically coupled to ground. PMOS transistor 158 from FIG. 1 is removed, leaving PMOS transistor 1356. A source terminal of PMOS transistor 1356 is electrically coupled to the nominal supply voltage and a drain terminal of PMOS is electrically coupled to the reduced supply voltage line 1360. A gate terminal of PMOS transistor 1356 is connected to a Bias_p reference signal 1392, thereby allowing a shared PMOS transistor to replace PMOS transistors 156, 158 of FIG. 1.

Figure 14:
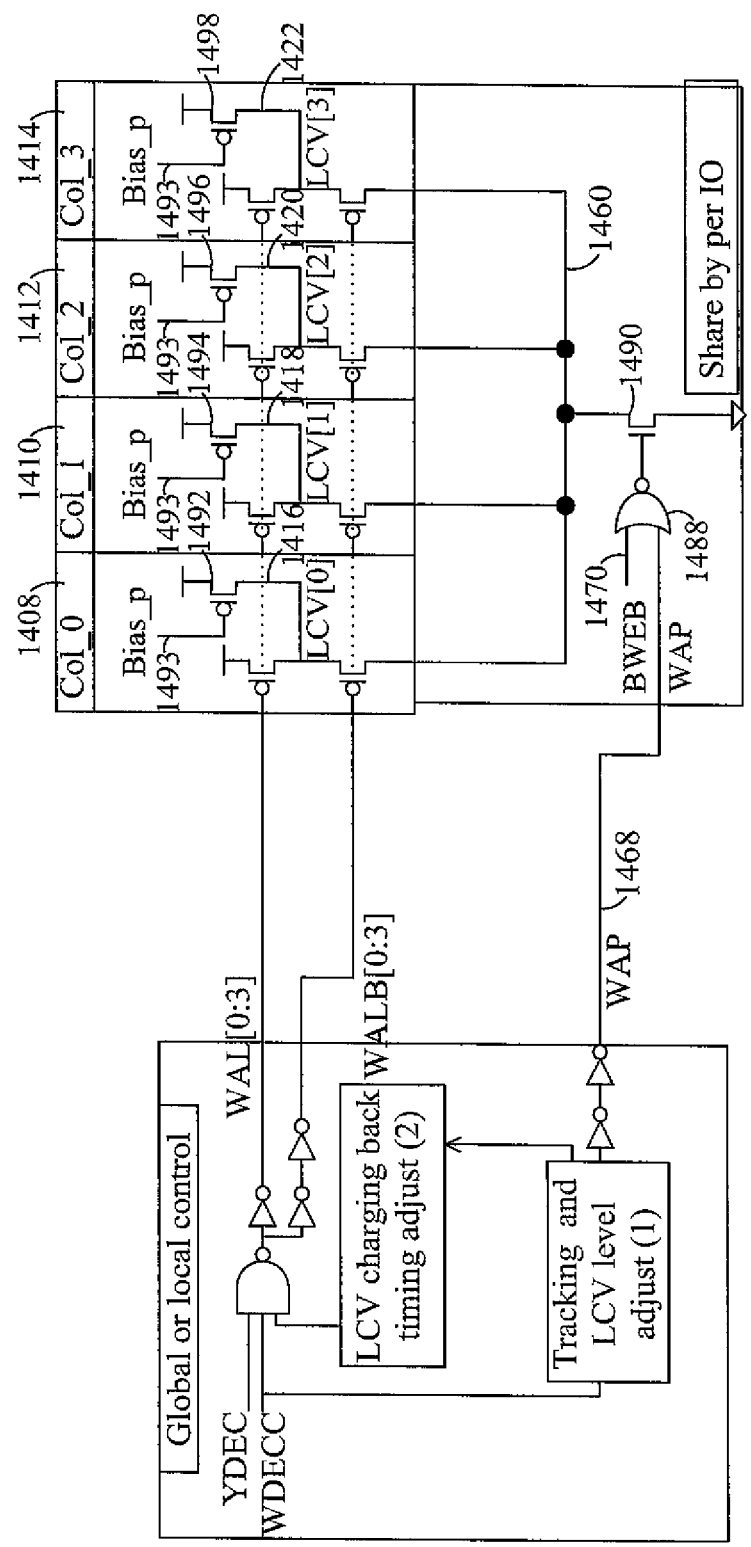
FIG. 14 is a schematic view of a pulsed dynamic LCV circuit in accordance with at least one embodiment.

FIG. 14 is a schematic view of an alternative pulsed dynamic LCV circuit in accordance with at least one embodiment. The WAP signal 1468 and BWEB signal 1470 are transmitted to a NOR gate 1488. Output from the NOR gate 1488 is electrically coupled to an NMOS transistor 1490. A drain terminal of the NMOS transistor 1490 is electrically coupled to the reduced supply voltage line 1460. A source terminal of the NMOS transistor 1490 is electrically coupled to ground. PMOS transistors 156, 158 from FIG. 1 are removed. A source terminal of a PMOS transistor 1492 is electrically coupled to LCV[0] 1416. A gate terminal of the PMOS transistor 1492 is electrically coupled to Bias_p 1493 to enable a power signal corresponding to LCV[0] 1416 to be present at a drain terminal of PMOS transistor 1492 and provided to Col_0 SRAM 1408. A source terminal of a PMOS transistor 1494 is electrically coupled to LCV[1] 1418. A gate terminal of the PMOS transistor 1494 is electrically coupled to Bias_p 1493 to enable a power signal corresponding to LCV[1] 1418 to be present at a drain terminal of PMOS transistor 1494 and provided to Col_1 SRAM 1410. A source terminal of a PMOS transistor 1496 is electrically coupled to LCV[2] 1420. A gate terminal of the PMOS transistor 1496 is electrically coupled to Bias_p 1493 to enable a power signal corresponding to LCV[2] 1420 to be present at a drain terminal of PMOS transistor 1496 and provided to Col_2 SRAM 1412. A source terminal of a PMOS transistor 1498 is electrically coupled to LCV[3] 1422. A gate terminal of the PMOS transistor 1498 is electrically coupled to Bias_p 1493 to enable a power signal corresponding to LCV[3] 1422 to be present at a drain terminal of PMOS transistor 1498 and provided to Col_3 SRAM 1414.

FIG. 15 is a flowchart of a method 1500 for improving a write data operation of an SRAM in accordance with at least one embodiment. The method 1500 selectably adjusts at least one LCV voltage level and transition timing characteristics to improve a write data operation of an SRAM. At step 1510, a pulsed dynamic LCV circuit selectably adjusts a reduction of voltage associated with said write data operation. Step 1510 includes selecting between a nominal supply voltage and at least one reduced supply voltage. At step 1520, the pulsed dynamic LCV circuit is selectably adjusting timing of a voltage transition associated with the write data operation from the at least one reduced supply voltage to said nominal supply voltage. Step 1520 includes selecting between a plurality of different delays for the voltage transition. At step 1530, the pulsed dynamic LCV circuit is performing the write data operation by first performing the step of selectably adjusting a reduction of voltage and then performing the step of selectably adjusting timing of a voltage transition.

One aspect of this description relates to a circuit. The circuit includes a supply voltage circuit electrically coupled to a memory device configured to provide a voltage level to the memory device during a write data operation. The circuit further includes a voltage adjustment circuit electrically coupled to the supply voltage circuit, the voltage adjustment circuit configured to provide at least one voltage level control signal to control one of a plurality of different voltages, at least one of the plurality of different voltages having a voltage level lower than a specified nominal supply voltage level. The circuit further includes a timing adjustment circuit electrically coupled to the supply voltage circuit, the timing adjustment circuit configured to provide at least one voltage transition timing control signal to the supply voltage circuit, wherein the supply voltage circuit is configured to provide at least one of the plurality of different voltages to the memory device during the write data operation.

Another aspect of this description relates to a circuit. The circuit includes a voltage adjustment circuit configured to generate at least one voltage level control signal. The circuit further includes a timing adjustment circuit coupled to the voltage adjustment circuit and configured to receive the at least one voltage level control signal, and to output at least one voltage transition timing signal. The circuit further includes an adjustable power supply circuit coupled to the voltage adjustment circuit and the timing adjustment circuit, configured to receive the at least one voltage transmission timing signal, and configured to provide at least one adjustable supply voltage to a memory device during a write data operation, the at least one adjustable supply voltage having a voltage level lower than a specified nominal supply voltage level.

Still another aspect of this description relates to a circuit. The circuit includes a voltage supply circuit, a voltage adjustment circuit and a timing adjustment circuit. The voltage supply circuit includes a first voltage supply section and a second voltage supply section. The first voltage supply section is coupled between a nominal voltage source and the second voltage supply section, and the second voltage supply section is configured to provide a reduced voltage source to the first voltage supply section. The voltage adjustment circuit is electrically coupled to the voltage supply circuit, the voltage adjustment circuit configured to provide at least one voltage level control signal to the second supply voltage supply section. The timing adjustment circuit is electrically coupled to the voltage supply circuit, the timing adjustment circuit configured to provide at least one voltage transition timing control signal to the first supply voltage supply section to control at least one of a plurality of different voltages for being provided to a memory device during a write data operation.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A circuit comprising:
  a supply voltage circuit electrically coupled to a memory device configured to provide a voltage level to the memory device during a write data operation;
  a voltage adjustment circuit electrically coupled to the supply voltage circuit, the voltage adjustment circuit configured to provide at least one voltage level control signal to control one of a plurality of different voltages, at least one of the plurality of different voltages having a voltage level lower than a specified nominal supply voltage level;
  a timing adjustment circuit electrically coupled to the supply voltage circuit, the timing adjustment circuit configured to provide at least one voltage transition timing control signal to the supply voltage circuit, wherein the supply voltage circuit is configured to provide at least one of the plurality of different voltages to the memory device during the write data operation.

2. The circuit of claim 1, wherein
  the supply voltage circuit is configured to receive the at least one voltage level control signal and to output at least one of the plurality of different voltages in accordance with a length of time between a logic state transition of the at least one voltage level control signal.

3. The circuit of claim 2, wherein
  the supply voltage circuit comprises:
    a voltage keeper circuit having a first metal oxide semiconductor (MOS) transistor electrically connected in series with a second MOS transistor between a nominal voltage source and a reduced voltage source, the first MOS transistor having a gate terminal coupled to the reduced voltage source, the second MOS transistor having a gate terminal coupled to the reduced voltage source.

4. The circuit of claim 3, wherein
  the supply voltage circuit further comprises:
    a first supply voltage transistor; and
    a second supply voltage transistor;
  wherein a source terminal of the first supply voltage transistor is coupled to the nominal voltage source having the specified nominal supply voltage level, a drain terminal of the first supply voltage transistor is coupled to a drain terminal of the second supply voltage transistor, a source terminal of the second supply voltage transistor is coupled to the reduced voltage source, and a gate terminal of the first supply voltage transistor and a gate terminal of the second supply voltage transistor are configured to receive the at least one voltage transition timing control signal.

5. The circuit of claim 3, wherein
  the supply voltage circuit further comprises:
    a first supply voltage transistor; and
    a second supply voltage transistor;
  wherein a source terminal of the first supply voltage transistor is coupled to the nominal voltage source having the specified nominal supply voltage level, a drain terminal of the first supply voltage transistor is coupled to a drain terminal of the second supply voltage transistor, a source terminal of the second supply voltage transistor is coupled to the reduced voltage source, a gate terminal of the first supply voltage transistor is configured to receive the at least one voltage transition timing control signal, and a gate terminal of the second supply voltage transistor is configured to receive a complementary signal of the at least one voltage transition timing control signal.

6. The circuit of claim 1, wherein
  the voltage adjustment circuit comprises:
    a plurality of level adjustment transistors;
    a supply voltage transistor;
    a capacitor;
    a first inverter;
    a second inverter; and
    a NAND gate;
  a first terminal of the supply voltage transistor is coupled to a plurality of first terminals of the plurality of level adjustment transistors and is configured to receive a write control clock signal;
  a second terminal of the supply voltage transistor is coupled to a plurality of second terminals of the plurality of level adjustment transistors, the capacitor and an input terminal of the first inverter;
  a third terminal of the supply voltage transistor is coupled to a nominal voltage source having the specified nominal supply voltage level;
  a plurality of third terminals of the plurality of level adjustment transistors are selectively coupled to ground;
  the NAND gate is configured to receive the write control clock signal and an output signal of the first inverter; and
  the second inverter is configured to receive an output signal of the NAND gate and output the at least one voltage level control signal.

7. The circuit of claim 1, wherein
  the timing adjustment circuit comprises:
    a plurality of multiplexer circuits configured to receive a timing bit signal and to generate the at least one voltage transition timing control signal, and at least one multiplexer circuit of the plurality of multiplexer circuits is configured to receive the at least one voltage level control signal.

8. A circuit comprising:
a voltage adjustment circuit configured to generate at least one voltage level control signal;
a timing adjustment circuit coupled to the voltage adjustment circuit and configured to receive the at least one voltage level control signal, and to output at least one voltage transition timing signal; and
an adjustable power supply circuit coupled to the voltage adjustment circuit and the timing adjustment circuit, configured to receive the at least one voltage transition timing signal, and configured to provide at least one adjustable supply voltage to a memory device during a write data operation, the at least one adjustable supply voltage having a voltage level lower than a specified nominal supply voltage level.

9. The circuit of claim 8, wherein
the voltage adjustment circuit comprises:
    a plurality of level adjustment transistors;
    a supply voltage transistor;
    a capacitor;
    a first inverter;
    a second inverter; and
    a NAND gate;
a first terminal of the supply voltage transistor is coupled to a plurality of first terminals of the plurality of level adjustment transistors and is configured to receive a write control clock signal;
a second terminal of the supply voltage transistor is coupled to a plurality of second terminals of the plurality of level adjustment transistors, the capacitor and an input terminal of the first inverter;
a third terminal of the supply voltage transistor is coupled to a nominal voltage source having the specified nominal supply voltage level;
a plurality of third terminals of the plurality of level adjustment transistors are selectively coupled to ground;
the NAND gate is configured to receive the write control clock signal and an output signal of the first inverter; and
the second inverter is configured to receive an output signal of the NAND gate and to output the at least one voltage level control signal.

10. The circuit of claim 8, wherein
the voltage adjustment circuit comprises:
    a plurality of level adjustment transistors;
    a supply voltage transistor;
    a capacitor;
    a first inverter;
    a second inverter; and
    a NAND gate;
an input terminal of the first inverter and a first input terminal of the NAND gate are configured to receive a write control clock signal;
a plurality of first terminals of the plurality of level adjustment transistors are coupled to a first terminal of the supply voltage transistor and are configured to receive an inverted write control clock signal from the first inverter;
a second terminal of the supply voltage transistor is coupled to the capacitor and a second input terminal of the NAND gate, and is selectively coupled to a plurality of second terminals of the plurality of level adjustment transistors; and
the second inverter is configured to receive an output signal of the NAND gate and to output the at least one voltage level control signal.

11. The circuit of claim 8, wherein
the adjustable power supply circuit is configured to receive a plurality of different selectable output voltages and to selectively decrease the voltage level being provided to the memory device in accordance with a length of time of a logic state transition of the at least one voltage level control signal.

12. The circuit of claim 8, wherein
the voltage level being provided to the memory device is controlled in accordance with a length of time between a rising edge and a falling edge of an inverted signal of the at least one voltage level control signal.

13. The circuit of claim 8, wherein
the adjustable power supply circuit comprises:
    a first supply voltage transistor; and
    a second supply voltage transistor;
wherein a source terminal of the first supply voltage transistor is coupled to a nominal voltage source having the specified nominal supply voltage level, a drain terminal of the first supply voltage transistor is coupled to a drain terminal of the second supply voltage transistor, a source terminal of the second supply voltage transistor is coupled to a reduced voltage source, and a gate terminal of the first supply voltage transistor and a gate terminal of the second supply voltage transistor are configured to receive the at least one voltage transition timing signal.

14. The circuit of claim 8, wherein
the adjustable power supply circuit comprises:
    a first supply voltage transistor; and
    a second supply voltage transistor;
wherein a source terminal of the first supply voltage transistor is coupled to a nominal voltage source having the specified nominal supply voltage level, a drain terminal of the first supply voltage transistor is coupled to a drain terminal of the second supply voltage transistor, a source terminal of the second supply voltage transistor is coupled to a reduced voltage source, a gate terminal of the first supply voltage transistor is configured to receive the at least one voltage transition timing signal, and a gate terminal of the second supply voltage transistor is configured to receive a complementary signal of the at least one voltage transition timing signal.

15. The circuit of claim 8, further comprising:
a voltage keeper circuit having a first metal oxide semiconductor (MOS) transistor electrically connected in series with a second MOS transistor between a nominal voltage source having the specified nominal supply voltage level and a reduced voltage source, the first MOS transistor having a gate terminal electrically coupled to the reduced voltage source, the second MOS transistor having a gate terminal electrically coupled to the reduced voltage source.

16. A circuit comprising:
a voltage supply circuit comprising:
    a first voltage supply section, and
    a second voltage supply section, the first voltage supply section coupled between a nominal voltage source and the second voltage supply section, the second voltage supply section configured to provide a reduced voltage source to the first voltage supply section;
a voltage adjustment circuit electrically coupled to the voltage supply circuit, the voltage adjustment circuit configured to provide at least one voltage level control signal to the second voltage supply section; and a timing adjustment circuit electrically coupled to the voltage supply circuit, the timing adjustment circuit configured to provide at least one voltage transition timing control signal to the first voltage supply section to control at least one of a plurality of different voltages being provided to a memory device during a write data operation.

17. The circuit of claim 16, wherein the reduced voltage source has a voltage level lower than a specified nominal supply voltage level.

18. The circuit of claim 16, wherein the voltage supply circuit further comprises:

a voltage keeper circuit having a first metal oxide semiconductor (MOS) transistor electrically connected in series with a second MOS transistor between the nominal voltage source and the reduced voltage source, the first MOS transistor having a gate terminal electrically coupled to the reduced voltage source, the second MOS transistor having a gate terminal electrically coupled to the reduced voltage source.

19. The circuit of claim 16, wherein the second voltage supply section comprises:

a transistor;

a gate terminal is configured to receive an inverted signal of the at least one voltage level control signal;

a drain terminal is coupled to the first voltage supply section; and a source terminal is coupled to a ground terminal.

20. The circuit of claim 17, wherein the timing adjustment circuit comprises:

a plurality of multiplexer circuits configured to receive a timing bit signal and to generate the at least one voltage transition timing control signal, and at least one multiplexer circuit of the plurality of multiplexer circuits configured to receive the at least one voltage level control signal.

* * * * *